(12) United States Patent
Foster

(10) Patent No.: US 8,362,597 B1
(45) Date of Patent: Jan. 29, 2013

(54) SHIELDED PACKAGE HAVING SHIELD LID

(75) Inventor: Donald Craig Foster, Mesa, AZ (US)

(73) Assignee: Amkor Technology, Inc., Chandler, AZ (US)

(*) Notice: Subject to any disclaimer, the term of this patent is extended or adjusted under 35 U.S.C. 154(b) by 712 days.

(21) Appl. No.: 12/589,500

(22) Filed: Oct. 23, 2009

Related U.S. Application Data

(63) Continuation of application No. 10/992,036, filed on Nov. 17, 2004, now Pat. No. 7,629,674.

(51) Int. Cl.
H01L 23/552 (2006.01)
H01L 23/12 (2006.01)

(52) U.S. Cl. ........ 257/659; 257/660; 257/704; 257/728; 257/778; 257/E23.114

(58) Field of Classification Search .................. 257/659, 257/660, 704, 728, 778, E23.114
See application file for complete search history.

(56) References Cited

U.S. PATENT DOCUMENTS

| | | | |
|---|---|---|---|
| 4,925,024 A | 5/1990 | Ellenberger et al. | |
| 5,166,772 A * | 11/1992 | Soldner et al. | 257/659 |
| 5,354,951 A * | 10/1994 | Lange et al. | 174/372 |
| 5,416,358 A | 5/1995 | Ochi et al. | |
| 5,473,191 A | 12/1995 | Tanaka | |
| 5,614,694 A | 3/1997 | Gorenz, Jr. et al. | |
| 5,656,864 A | 8/1997 | Mitsue et al. | |
| 5,907,477 A | 5/1999 | Tuttle et al. | |
| 5,940,271 A | 8/1999 | Mertol | |
| 6,002,086 A * | 12/1999 | Yajima | 174/373 |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,433,420 B1 | 8/2002 | Yang et al. | |
| 6,465,280 B1 * | 10/2002 | Martin et al. | 438/125 |
| 6,472,598 B1 * | 10/2002 | Glenn | 174/535 |
| 6,602,737 B2 | 8/2003 | Wu | |
| 6,686,649 B1 * | 2/2004 | Mathews et al. | 257/659 |
| 6,936,917 B2 * | 8/2005 | Lopata et al. | 257/704 |
| 2002/0089832 A1 | 7/2002 | Huang | |
| 2002/0167060 A1 * | 11/2002 | Buijsman et al. | 257/423 |
| 2003/0067757 A1 | 4/2003 | Richardson et al. | |
| 2003/0102552 A1 | 6/2003 | Martin et al. | |
| 2005/0280139 A1 | 12/2005 | Zhao et al. | |

FOREIGN PATENT DOCUMENTS

JP 06-132423 5/1994

* cited by examiner

Primary Examiner — Nitin Parekh
(74) Attorney, Agent, or Firm — McKay and Hodgson, LLP; Serge J. Hodgson

(57) ABSTRACT

A shielded package includes a shield assembly having a shield fence, a shield lid, and a shield lid adhesive electrically coupling the shield lid to the shield fence. The shield fence includes a porous sidewall through which molding compound passes during molding of the shielded package. Further, the shield fence includes a central aperture through which an electronic component is die attached and wire bonded.

13 Claims, 10 Drawing Sheets

SHIELDED PACKAGE HAVING SHIELD LID

RELATED APPLICATIONS

This application is a continuation of Foster, U.S. patent application Ser. No. 10/992,036, filed on Nov. 17, 2004, now U.S. Pat. No. 7,629,674 which is herein incorporated by reference in its entirety.

BACKGROUND OF THE INVENTION

1. Field of the Invention

The present invention relates generally to the packaging of electronic components. More particularly, the present invention relates to a shielded electronic component package and method of fabricating the same.

2. Description of the Related Art

As the art moved to smaller, lighter weight, and higher frequency el ectronic devices such as cellular telephones, integrated circuit packages utilized in these electronic devices were increasingly placed closer to other electronic components and structures. Due to this reduced spacing, radiation such as electromagnetic or radio frequency (RF) radiation emanating from an integrated circuit package had a greater probability of interfering with the normal operation of an adjacent electronic component and vice versa. However, such interference was unacceptable depending upon the particular application.

Further, to prevent interfering with the normal operation of adjacent electronic devices, e.g., radio receivers, it was important to prevent the integrated circuit package from emanating unwanted radiation to the ambient air. Similarly, to prevent interfering with the normal operation of the integrated circuit package, it was important to protect the electronic component(s) of the integrated circuit package from radiation emanating from adjacent electronic devices, e.g., radio transmitters. Stated generally, it was important to prevent unwanted radiation from electronic component(s) of the integrated circuit package from reaching the surrounding air and vice versa.

To prevent unacceptable electromagnetic interference, a shielding system was used. Typically, an electrically conductive metallic enclosure was placed around the integrated circuit package after the integrated circuit package was mounted to the larger substrate such as the printed circuit mother board. However, fabricating such a metallic enclosure and separately attaching the metallic enclosure to the printed circuit mother board was relatively cumbersome, complex, and costly.

SUMMARY OF THE INVENTION

In accordance with one embodiment of the present invention, a shielded package includes a shield assembly having a shield fence, a shield lid, and a shield lid adhesive electrically coupling the shield lid to the shield fence. The shield fence includes a porous sidewall through which molding compound passes during molding of the shielded package. Further, the shield fence includes a central aperture through which an electronic component is die attached and wire bonded.

In accordance with another embodiment, the shield assembly of the shielded package includes the shield fence and an electrically conductive ink electrically coupled to the shield fence.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
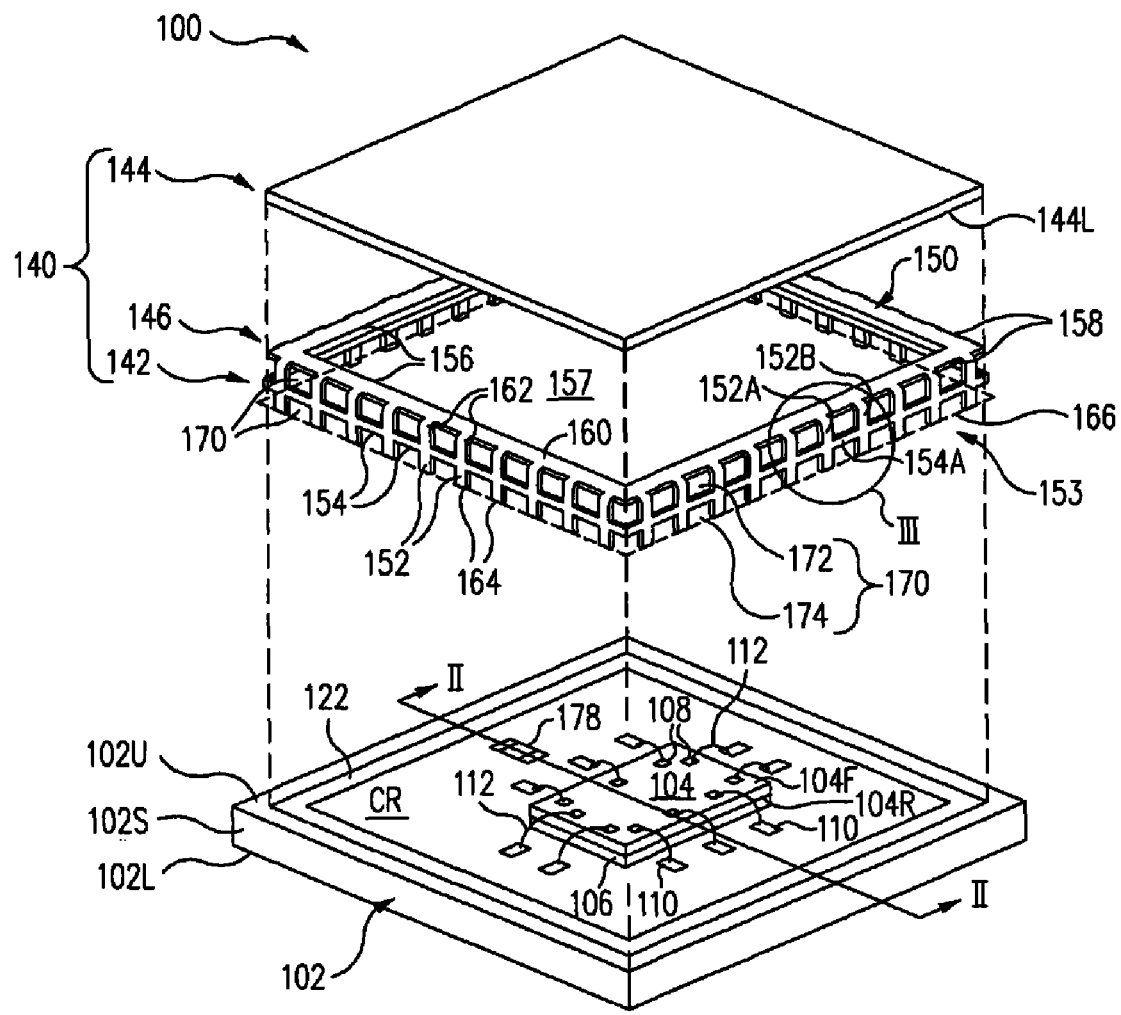
FIG. 1 is an exploded perspective view of a shielded package 100 in accordance with one embodiment of the present invention.

Referring to FIG. 1, a shielded package 100 includes a shield assembly 140 having a shield fence 142, a shield lid 144, and a shield lid adhesive 146 electrically coupling shield lid 144 to shield fence 142. Shield fence 142 includes molding apertures 170 through which molding compound passes during molding of shielded package 100. Further, shield fence 142 includes a central aperture 157 through which an electronic component 104 is die attached and wire bonded to a substrate 102.

Figure 2:
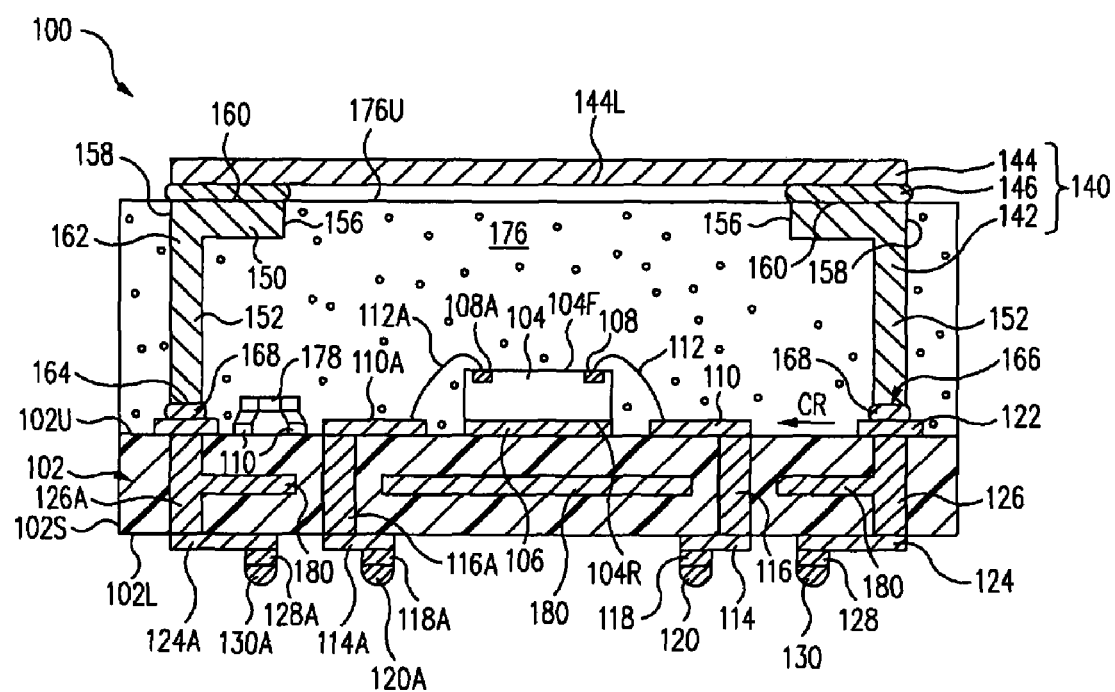
FIG. 2 is a cross-sectional view of the shielded package along the line II-II of FIG. 1.

More particularly, FIG. 1 is an exploded perspective view of a shielded package 100 in accordance with one embodiment of the present invention. FIG. 2 is a cross-sectional view of shielded package 100 along the line II-II of FIG. 1.

Referring now to FIGS. 1 and 2 together, shielded package 100 includes a substrate 102 such as a printed circuit board, ceramic or tape although other materials are used in other embodiments. Substrate 102 includes an upper, e.g., first, surface 102U and a lower, e.g., second, surface 102L.

An electronic component 104 such as an integrated circuit is mounted to upper surface 102U with, for example, adhesive 106. More particularly, a rear, e.g., first, surface 104R of electronic component 104 is mounted to upper surface 102U of substrate 102 by adhesive 106.

A front, e.g., second, surface 104F of electronic component 104 has formed thereon bond pads 108 including a first bond pad 108A. Bond pads 108 are electrically connected to the various internal circuitry of electronic component 104 (not shown).

Formed on upper surface 102U of substrate 102 are a plurality of electrically conductive upper traces 110 including a first upper trace 110A. Bond pads 108 are electrically connected to upper traces 110 by electrically conductive bond wires 112. To illustrate, bond pad 108A is electrically connected to upper trace 110A by a first bond wire 112A of the plurality of bond wires 112. The other bond pads 108 are electrically connected to the other upper traces 110 by the other bond wires 112 in a similar manner so are not discussed further to avoid detracting from the principles of the invention.

Formed on lower surface 102L of substrate 102 are a plurality of electrically conductive lower traces 114 including a first lower trace 114A. Upper traces 110 are electrically connected to lower traces 114 by electrically conductive vias 116 extending through substrate 102 from upper surface 102U to lower surface 102L.

To illustrate, upper trace 110A is electrically connected to lower trace 114A by a first via 116A of the plurality of vias 116. The other upper traces 110 are electrically connected to the other lower traces 114 by the other vias 116 in a similar manner so are not discussed further to avoid detracting from the principles of the invention.

Formed on lower traces 114 are electrically conductive pads 118. To illustrate, a first pad 118A of the plurality of pads 118 is formed on and electrically connected to lower trace 114A. Formed on and electrically connected to pads 118 are electrically conductive interconnection balls 120, e.g., solder. To illustrate, a first interconnection ball 120A of the plurality of interconnection balls 120 is formed on and electrically connected to pad 118A.

As set forth above, an electrically conductive pathway between bond pad 108A and interconnection ball 120A is formed by bond wire 112A, upper trace 110A, via 116A, lower trace 114A and pad 118A. The other bond pads 108, bond wires 112, upper traces 110, vias 116, lower traces 114, pads 118 and interconnection balls 120 are electrically connected to one another in a similar fashion so are not discussed further to avoid detracting from the principles of the invention.

Also formed on upper surface 102U of substrate 102 is an electrically conductive ground ring 122. In accordance with this embodiment, ground ring 122 is a rectangular annulus around the entire periphery of upper surface 102U. In another embodiment, instead of being a single integral conductor, ground ring 122 is formed from a plurality of conductors, e.g., lands.

Formed on lower surface 102L of substrate 102 are electrically conductive lower ground traces 124 including a first lower ground trace 124A. Ground ring 122 is electrically connected to lower ground traces 124 by electrically conductive ground vias 126 extending through substrate 102 from upper surface 102U to lower surface 102L. To illustrate, ground ring 122 is electrically connected to lower ground trace 124A by a first ground via 126A of the plurality of ground vias 126.

Formed on lower ground traces 124 are electrically conductive ground pads 128. To illustrate, a first ground pad 128A of the plurality of ground pads 128 is formed on and electrically connected to lower ground trace 124A. Formed on and electrically connected to ground pads 128 are electrically conductive ground interconnection balls 130, e.g., solder. To illustrate, a first ground interconnection ball 130A of the plurality of ground interconnection balls 130 is formed on ground pad 128A.

As set forth above, an electrically conductive pathway between ground ring 122 and ground interconnection ball 130A is formed by ground via 126A, lower ground trace 124A and ground pad 128A. Generally, shielded package 100 includes at least one ground via 126, lower ground trace 124, ground pad 128 and ground interconnection ball 130. The other ground vias 126, lower ground traces 124, ground pads 128 and ground interconnection balls 130, if any, are electrically connected to one another and ground ring 122 in a similar fashion so are not discussed further to avoid detracting from the principles of the invention.

Although particular electrically conductive pathways between bond pads 108, ground ring 122 and interconnection balls 120, ground interconnection balls 130, respectively, are described above, in light of this disclosure, it is understood that other electrically conductive pathways can be formed. For example, substrate 102 is a multi-layered laminate substrate and, instead of straight-through vias 116, 126, a plurality of electrically conductive traces on various layers in substrate 102 are interconnected by a plurality of electrically conductive vias to form the electrical interconnections between upper traces 110, ground ring 122 and traces 114, 124, respectively.

In one embodiment, interconnection balls 120, 130 are distributed in an array format to form a ball grid array (BGA) package. Alternatively, interconnection balls 120, 130 are not formed, e.g., to form a metal land grid array (LGA) package or a leadless chip carrier (LCC) package. In another alternative, pads 118, 128 are not formed and interconnection balls 120, 130 are formed directly on lower traces 114, 124, respectively. Further, contact metallizations are interposed between the various conductors in other embodiments. Other electrically conductive pathway modifications will be obvious to those of skill in the art.

In one embodiment, dielectric layers (not shown), e.g., solder masks, cover and protect portions of upper traces 110, lower traces 114, lower ground traces 124 and/or ground ring 122.

Shielded package 100 further includes a shield assembly 140. In this embodiment, shield assembly 140 includes a shield fence 142, a shield lid 144, and a shield lid adhesive 146. Illustratively, shield fence 142 and shield lid 144 are formed of an electrically conductive material or materials, e.g., stainless steel, copper, or other electrically conductive material. For example, an electrically conductive material is stamped, etched or otherwise shaped to form shield fence 142 and shield lid 144.

Figure 3:
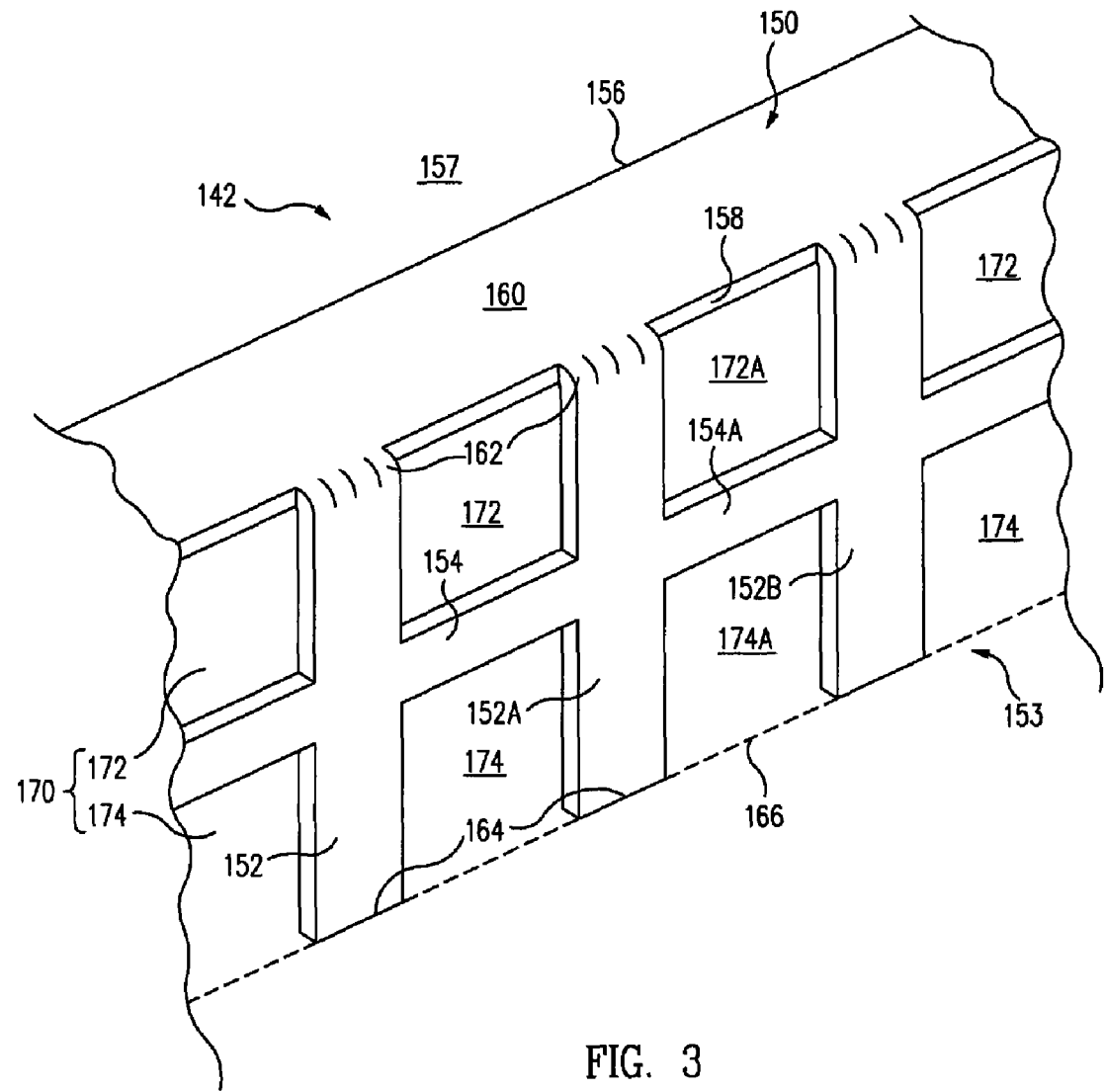
FIG. 3 is an enlarged perspective view of a region III of a shield fence of the shielded package of FIG. 1.

FIG. 3 is an enlarged perspective view of a region III of shield fence 142 of shielded package 100 of FIG. 1. Referring now to FIGS. 1, 2, and 3 together, shield fence 142 includes a shield lid mounting ring 150, posts 152, and post supports 154. Posts 152 are sometimes called legs or fingers.

Shield lid mounting ring 150 is a rectangular annulus and includes an inner periphery 156 and an outer periphery 158. Inner periphery 156 defines a central aperture 157 of shield lid mounting ring 150 and more generally of shield fence 142.

Shield lid mounting ring 150 further includes a shield lid mounting surface 160. Shield lid mounting surface 160 is parallel to upper surface 102U of substrate 102, e.g., lies in a horizontal plane. More generally, shield lid mounting ring 150 is parallel to upper surface 102U of substrate 102.

Extending from outer periphery 158 of shield lid mounting ring 150 are posts 152. Posts 152 included first, e.g., upper, ends 162 and second, e.g., lower, ends 164.

Posts 152 are perpendicular to shield lid mounting ring 150, e.g., lie in vertical planes. Upper ends 162 of posts 152 are bends extending downwards from shield lid mounting ring 150. Accordingly, posts 152 extend downwards from shield lid mounting ring 150 and towards substrate 102. Posts 152 are shaped as rectangular posts in accordance with this embodiment.

Lower ends 164 of posts 152 are surfaces parallel to upper surface 102U of substrate 102. Lower ends 164 of posts 152 collectively define a shield connection surface 166 of shield fence 142 and generally of shield assembly 140 as indicated by the dashed line.

Shield connection surface 166 of shield fence 142 corresponds in shape to ground ring 122, e.g., shield connection surface 166 and ground ring 122 are both rectangular annuli of approximately the same dimension. More particularly, when shield assembly 140 is mounted to substrate 102, shield connection surface 166 of shield fence 142 abuts ground ring 122 as best shown in FIG. 2. This allows shield fence 142 and more generally shield assembly 140 to be electrically connected to ground ring 122.

In one embodiment, shield fence 142 and more specifically shield connection surface 166 is mounted and electrically connected to ground ring 122 by electrically conductive ground ring adhesive 168. Illustratively, electrically conductive ground ring adhesive 168 is an electrically conductive epoxy adhesive or solder although other electrically conductive adhesives are used in other embodiments. Ground ring adhesive 168 is not illustrated in FIGS. 1 and 3 for purposes of clarity.

Post supports 154 extend between and connected adjacent posts 152, e.g., extend in the horizontal direction. Post supports 154 support posts 152 and generally provide rigidity and strength to shield fence 142 in one embodiment.

To illustrate, a first post support 154A of the plurality of post supports 154 extend horizontally between a first post 152A of the plurality of posts 152 and a second post 152B of the plurality of posts 152.

Posts 152 and post supports 154 define molding apertures 170. Generally, posts 152 and post supports 154 form a porous sidewall 153, sometimes called a porous opening sidewall, of shield fence 142.

As set forth further below, molding compound passes through molding apertures 170 to enclose electronic component 104 and any other electronic components mounted to upper surface 102U, bond wires 112, upper surface 102U of substrate 102, posts 152, and post supports 154.

Further, as those of skill in the art will understand, by forming molding apertures 170 with a sufficiently small area, radiation is prevented from passing through molding apertures 170. Generally, the maximum allowable area of molding apertures 170 to prevent emissions, e.g., RF emissions, is determined by the operating frequency(ies) of electronic components of shielded package 100.

Molding apertures 170 include upper, e.g., first, molding apertures 172 and lower, e.g., second, molding apertures 174 in accordance with this embodiment. Generally, shield lid mounting ring 150, posts 152, post supports 154, and posts 152 define upper molding apertures 172. Further, posts 152 and post supports 154 define lower molding apertures 174.

To illustrate, shield lid mounting ring 150, post 152A, post support 154A, and post 152B define a first upper molding aperture 172A of the plurality of upper molding apertures 172. To further illustrate, post 152A, post 152B and post support 154A define a first lower molding aperture 174A of the plurality of lower molding apertures 174. The other upper molding apertures 172 and lower molding apertures 174 are defined in a similar manner and so are not discuss further to avoid detracting from the principles of invention.

In accordance with one embodiment, post supports 154 are optional and are not formed. In accordance with this embodiment, molding apertures 170 are define by shield lid mounting ring 150 and posts 152.

Shield lid 144 is a planar lid corresponding closely in shape to outer periphery 158 of shield lid mounting ring 150 of shield fence 142. Shield lid 144 is mounted and electrically coupled to shield lid mounting ring 150 of shield fence 142 by shield lid adhesive 146. More particularly, shield lid 144 is mounted and electrically coupled to shield lid mounting surface 160 of shield lid mounting ring 150 by shield lid adhesive 146.

Illustratively, shield lid adhesive 146 is an electrically conductive epoxy adhesive or solder although other electrically conductive adhesives are used in other embodiments. Shield lid adhesive 146 is not illustrated in FIG. 3 for purposes of clarity.

As shown in FIG. 2, electronic component 104 including bond wires 112 are protected by an encapsulant 176, sometimes called molding compound or a mold cap. For simplicity, encapsulant 176 is not illustrated in FIGS. 1 and 3.

More generally, encapsulant 176 encloses upper surface 102U of substrate 102 including any structures thereon, e.g., ground ring 122, upper traces 110, bond wires 112, electronic component 104. Further, encapsulant 176 encloses shield fence 142 including ground ring adhesive 168.

Encapsulant 176 includes an upper surface 176U parallel to and in the same plane as shield lid mounting surface 160 of shield lid mounting ring 150 of shield fence 142. Generally, shield lid mounting surface 160 is uncovered by encapsulant 176 and exposed facilitating mounting of shield lid 144 by shield lid adhesive 146 to shield lid mounting surface 160.

A lower, e.g., first, surface 144L of shield lid 144 is directly adjacent to upper surface 176U of encapsulant 176. In accordance with this embodiment, shield lid 144 is slightly spaced above encapsulant 176 by shield lid adhesive 146. However, in other embodiment, shield lid 144 is in abutting contact with upper surface 176U of encapsulant 176.

As best shown in FIG. 1, ground ring 122 defines a central region CR of upper surface 102U of substrate 102 inwards of ground ring 122. The electronic components of shielded package 100 are mounted to central region CR. To illustrate, electronic component 104 and a second electronic component 178 are mounted to central region CR, i.e., for a total of two electronic components. However, in alternative embodiments, more or less than two electronic components are mounted to central region CR.

Further, instead of being mounted to upper surface 102U of substrate 102, electronic components 104 and/or 178 are embedded within substrate 102 below central region CR in one embodiment. For example, substrate 102 is a multilayer substrate, e.g., a multilayer laminate substrate, and electronic components 104 and/or 178 are formed on an interlayer of substrate 102.

Illustratively, electronic components 104 and 178 are semiconductor devices, discrete passive devices such as resistors, capacitors or inductors, discrete active devices, application-specific integrated circuits (ASICs), integrated passive networks or combinations thereof although other electronic components are used in other embodiments.

Shield assembly 140 functions as a shield to protect electronic components 104 and 178 from radiation. Examples of radiation of interest include electromagnetic radiation or radio frequency (RF) radiation. Stated another way, shield assembly 140 shields electronic components 104 and 178 from interference such as electromagnetic interference (EMI) or radio frequency interference (RFI). Further, shield assembly 140 functions as a shield to prevent electronic components 104 and 178 from emanating unwanted radiation to electronic components, structures, and/or air adjacent shielded package 100.

As set forth above, shield assembly 140 is formed of an electrically conductive material and is electrically connected to ground ring 122. More generally, shield assembly 140 is physically and electrically connected to ground ring 122.

As set forth above, ground ring 122 is electrically connected to ground interconnection balls 130. Accordingly, shield assembly 140 is electrically connected to ground interconnection balls 130.

During use, ground interconnection balls 130 are electrically connected to a reference voltage source, e.g., ground.

Accordingly, shield assembly 140 is electrically connected to the reference voltage source and held at a common potential, e.g., ground. Thus, shield assembly 140 is a ground shield that encloses electronic components 104 and 178. More particularly, shield lid 144 of shield assembly 140 is a ground shield above electronic components 104 and 178. Shield fence 142 of shield assembly 140 is a ground shield around electronic components 104 and 178.

Further, ground vias 126 collectively form a ground shield around the entire periphery and adjacent side 102S of substrate 102, this ground shield extending from upper surface 102U to lower surface 102L of substrate 102. Ground vias 126 are grounded by ground interconnection balls 130 for reasons similar to those set forth above regarding shield assembly 140. As those of skill in the art will understand, by spacing ground vias 126 sufficiently close to one another, radiation is prevented from passing between ground vias 126. Accordingly, ground vias 126 prevent lateral transmission of radiation through side 102S of substrate 102. In this manner, ground vias 126 form a ground shield below and beside electronic components 104 and 178.

In one embodiment, substrate 102 and/or the larger substrate, e.g. the printed circuit mother board, to which shielded package 100 is mounted, is formed with a ground plane. For example, substrate 102 includes a ground plane 180 electrically coupled to one or more of ground vias 126 as shown in FIG. 2. Ground plane 180 prevents radiation from passing through substrate 102. As a result, electronic components 104 and 178 are completely shielded from radiation in all directions. Further, electronic components, structures and/or air adjacent shielded package 100 are shielded from radiation emanating from electronic components 104 and 178.

Figure 4:
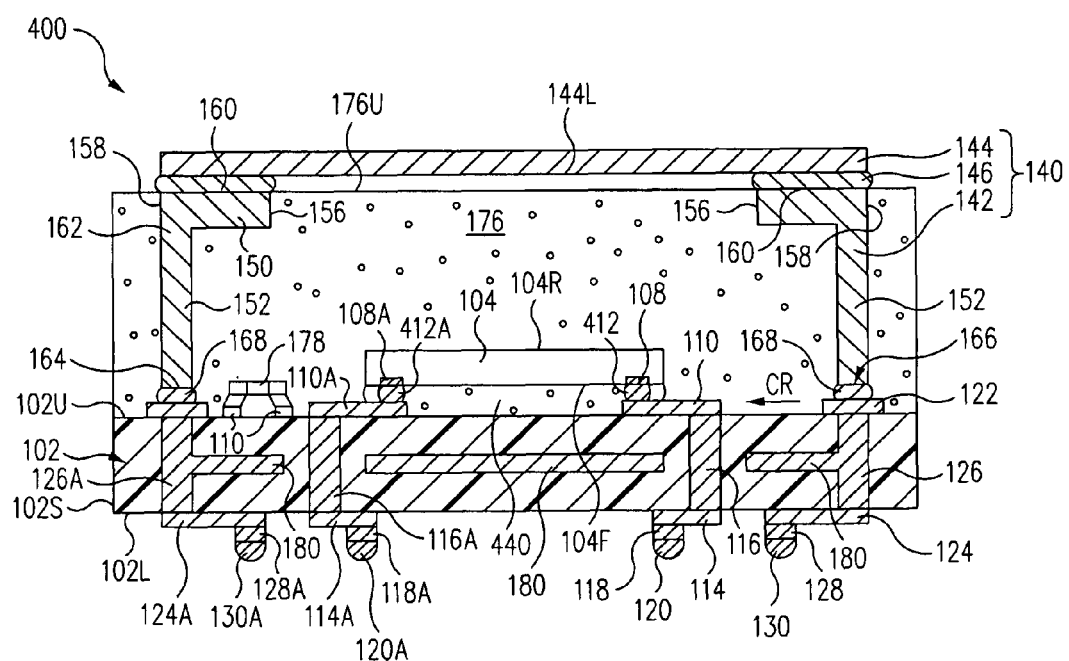
FIG. 4 is a cross-sectional view of a shielded package in accordance with another embodiment of the present invention.

FIG. 4 is a cross-sectional view of a shielded package 400 in accordance with another embodiment of the present invention. Shielded package 400 of FIG. 4 is substantially similar to shielded package 100 of FIG. 2 and only the significant differences are discussed below.

Referring now to FIG. 4, in this embodiment, electronic component 104 is flip chip mounted to substrate 102. More particularly, electronic component 104 is mounted to substrate 102 by bumps 412 including a first bump 412A. Bumps 412 physically and electrically connect bond pads 108 to upper traces 110. To illustrate, bump 412A physically and electrically connects bond pad 108A to upper trace 110A.

In this embodiment, to insure the reliability of the mounting of electronic component 104 to substrate 102, an underfill material 440 is applied to enclose bumps 412 and generally to fill the space between front surface 104F of electronic component 104 and upper surface 102U of substrate 102.

Figure 5:
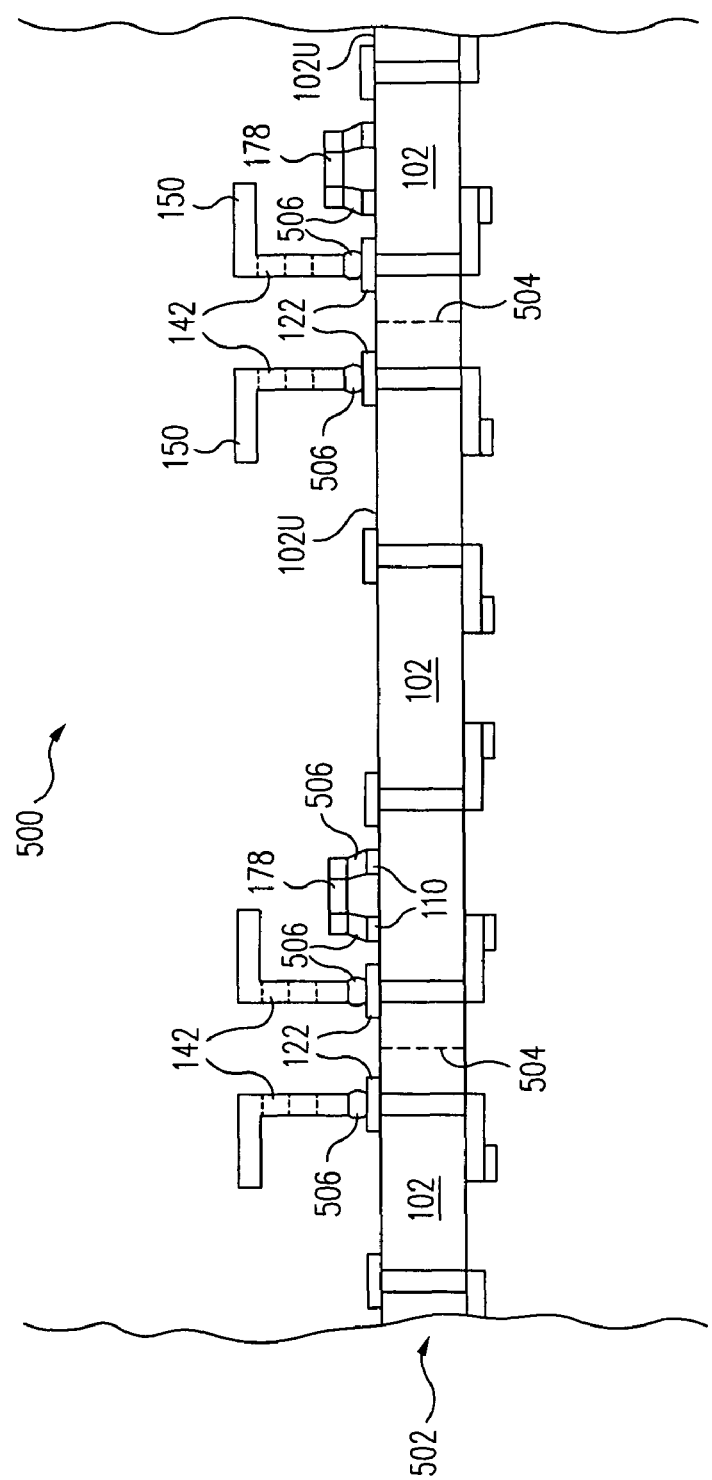
FIG. 5 is a cross-sectional view of an assembly during the fabrication of a plurality of shielded packages in accordance with one embodiment of the present invention.

FIG. 5 is a cross-sectional view of an assembly 500 during the fabrication of a plurality of shielded packages 100 in accordance with one embodiment of the present invention. Referring now to FIG. 5, an array substrate 502 includes a plurality of individual substrates 102 integrally connected together. Substrates 102 are delineated from one another by singulation streets 504.

Solder paste 506 is applied, e.g., by screen printing, on ground rings 122, e.g., around the entire ground rings 122 or on portions of ground rings 122 corresponding to posts 152. Solder paste 506 is also applied to selected ones of upper traces 110. In accordance with one embodiment, solder flux is applied before solder paste 506 although application of solder flux is optional.

Electronic components 178, e.g., passive components, are placed on solder paste 506 on upper traces 110. Electronic components 178 are sometimes called surface mount components. Shield fences 142 are also placed on solder paste 506 on ground rings 122.

In accordance with one embodiment, electronic components 178 are placed first and then shield fences 142 are placed second on solder paste 506. This facilitates placement of electronic components 178 as close as possible to shield fences 142 without interference from overhanging shield lid mounting rings 150 of shield fences 142.

Assembly 500 is heated to reflow solder paste 506 and mount electronic components 178 and shield fences 142 to substrates 102. Optionally, assembly 500 is flux clean to remove any flux residue from the reflow operation.

In the above manner, shield fences 142 are attached using a surface mount attach method, e.g. by soldering at the same time as surface mounting of electronic components 172 reducing the number of operations compared to mounting shield fences 142 separately from electronic components 172.

Figure 6:
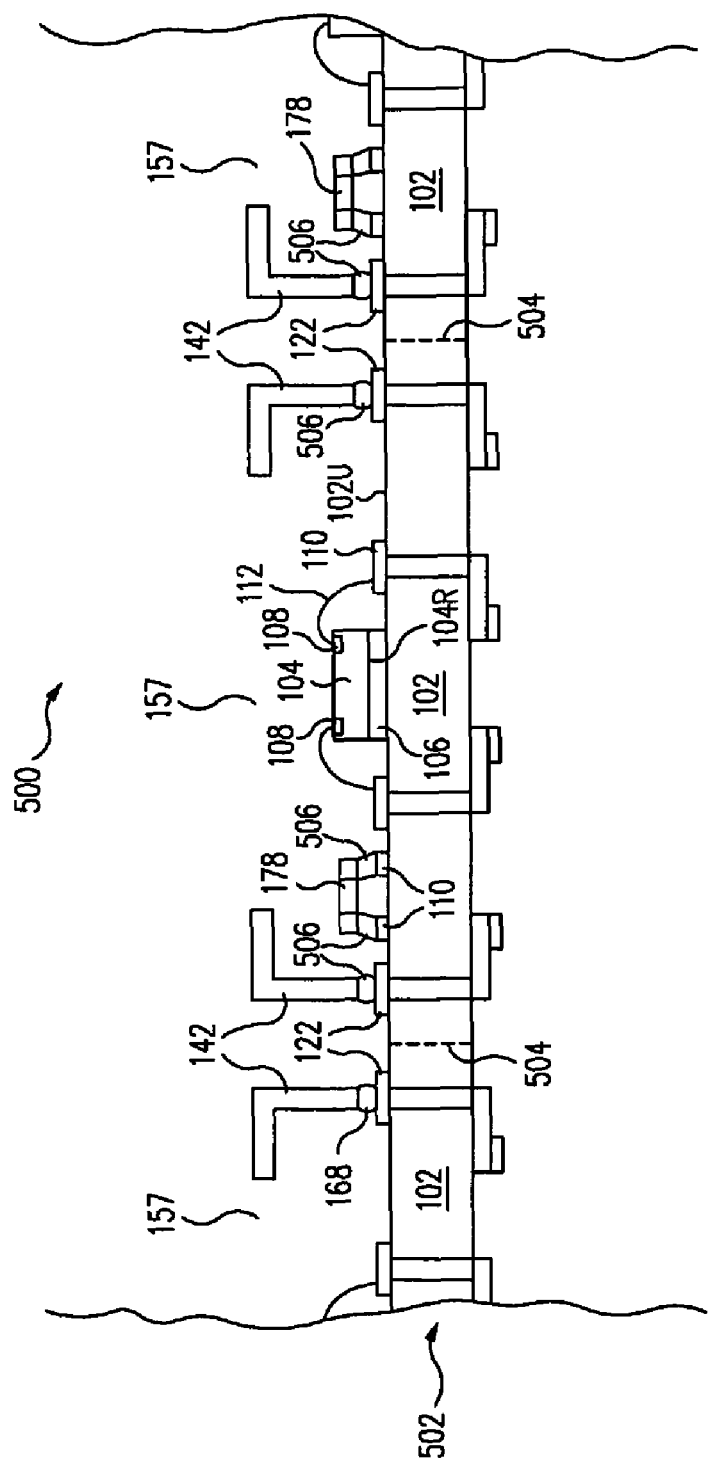
FIGS. 6, 7 and 8 are cross-sectional views of the assembly of FIG. 5 at further stages of fabrication.

FIG. 6 is a cross-sectional view of assembly 500 of FIG. 5 at a further stage of fabrication. Referring now to FIG. 6, rear surfaces 104R of electronic components 104 are mounted, sometimes called die attached, to upper surfaces 102U of substrates 102, e.g., with adhesives 106, sometimes called die attach adhesives. Bond pads 108 are electrically connected to upper traces 110 by bond wires 112. Optionally, upper surfaces 102U of substrates 102 are plasma cleaned to enhance the adhesion of molding compound discussed below.

The open top design of shield fences 142 facilitates die attachment and wire bonding of electronic components 104 and plasma cleaning of upper surfaces 102U of substrates 102. Generally, adhesives 106 and electronic components 104 are mounted to upper surfaces 102U of substrates 102 through central apertures 157 of shield fences 142. Further, bond pads 108 are wire bonded to upper traces 110 by a wire bonder passing through central apertures 157 of shield fences 142.

Although a wirebonding configuration of electronic component 104 is illustrated in FIG. 6, it is understood that other configurations, e.g., a flip chip configuration such as that illustrated in FIG. 4, are used in other embodiments. Generally, electronic components such as electronic components 104 and 178 of FIG. 1 are mounted, e.g., in wire bond, flip chip, or surface mount configurations, to central regions CR of upper surfaces 102U of substrates 102. The particular method used to mount these electronic components is not essential to this embodiment of the present invention.

Figure 7:
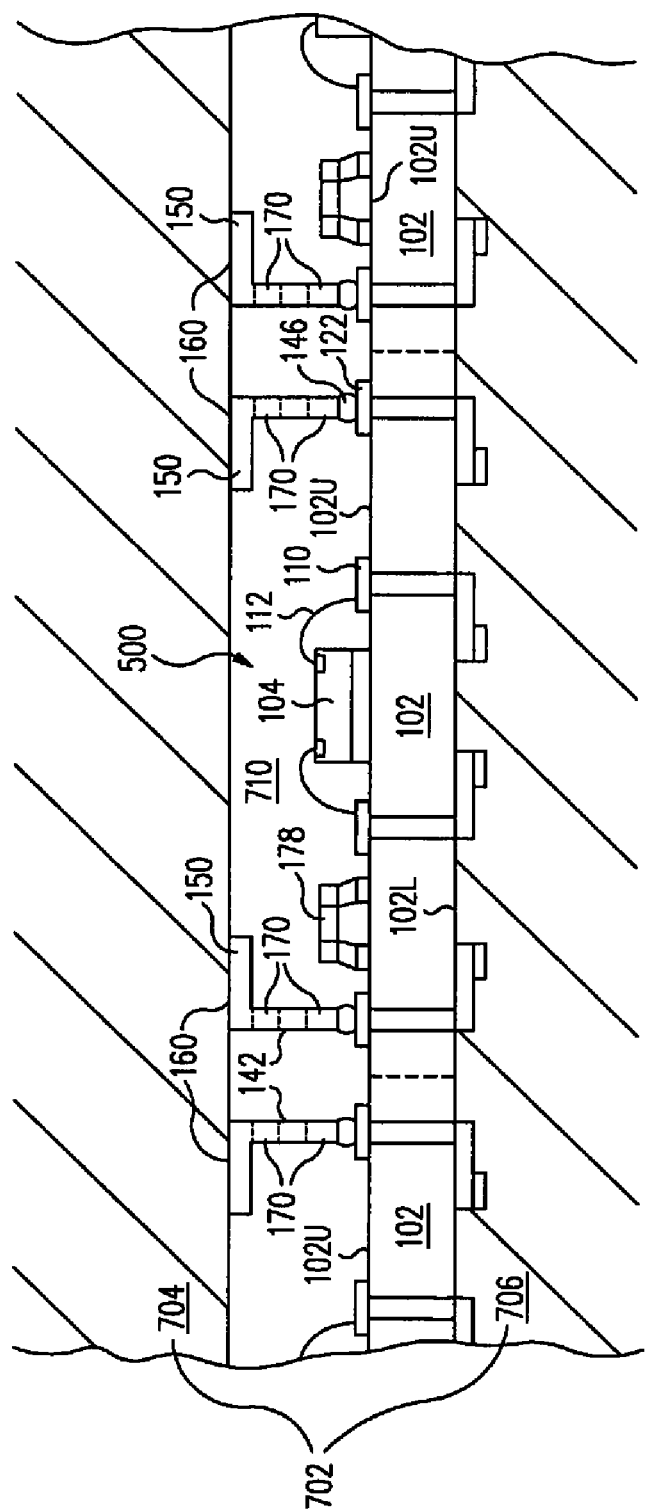

FIG. 7 is a cross-sectional view of assembly 500 of FIG. 6 at a further stage of fabrication in accordance with one embodiment of the present invention. Referring now to FIG. 7, assembly 500 is placed within a mold 702. In accordance with this embodiment, mold 702 includes an upper, e.g., first, mold half 704 and a lower, e.g., second mold half 706. Lower surfaces 102L of substrates 102 are in abutting contact with lower mold half 706. Shield lid mounting surfaces 160 of shield fences 142 are in abutting contact with upper mold half 704. In this manner, overmolding of shield lid mounting surfaces 160 is prevented.

Molding compound 710 is injected into mold 702. More particularly, molding compound 710 is injected into the cavity between upper surfaces 102U of substrates 102 and upper mold half 704. Molding compound 710 passes through molding apertures 170 of shield fences 142 to enclose electronic components 104, 178, bond wires 112, upper traces 110, ground rings 122, shield lid adhesives 146, and shield fences 142. As discussed above, molding compound 710 leaves uncovered and does not enclose shield lid mounting surfaces 160. After singulation, molding compound 710 forms encapsulants 176 for each individual shielded package 100.

In the event that molding compound 710 leaks between shield lid mounting surfaces 160 and upper mold half 704, i.e., flash is formed on shield lid mounting surfaces 160, a deflash process is used to remove molding compound 710 from shield lid mounting surfaces 160. Illustratively, a laser deflash process using UV or YAG laser is used. Assembly 500 is removed from mold 702.

Figure 8:
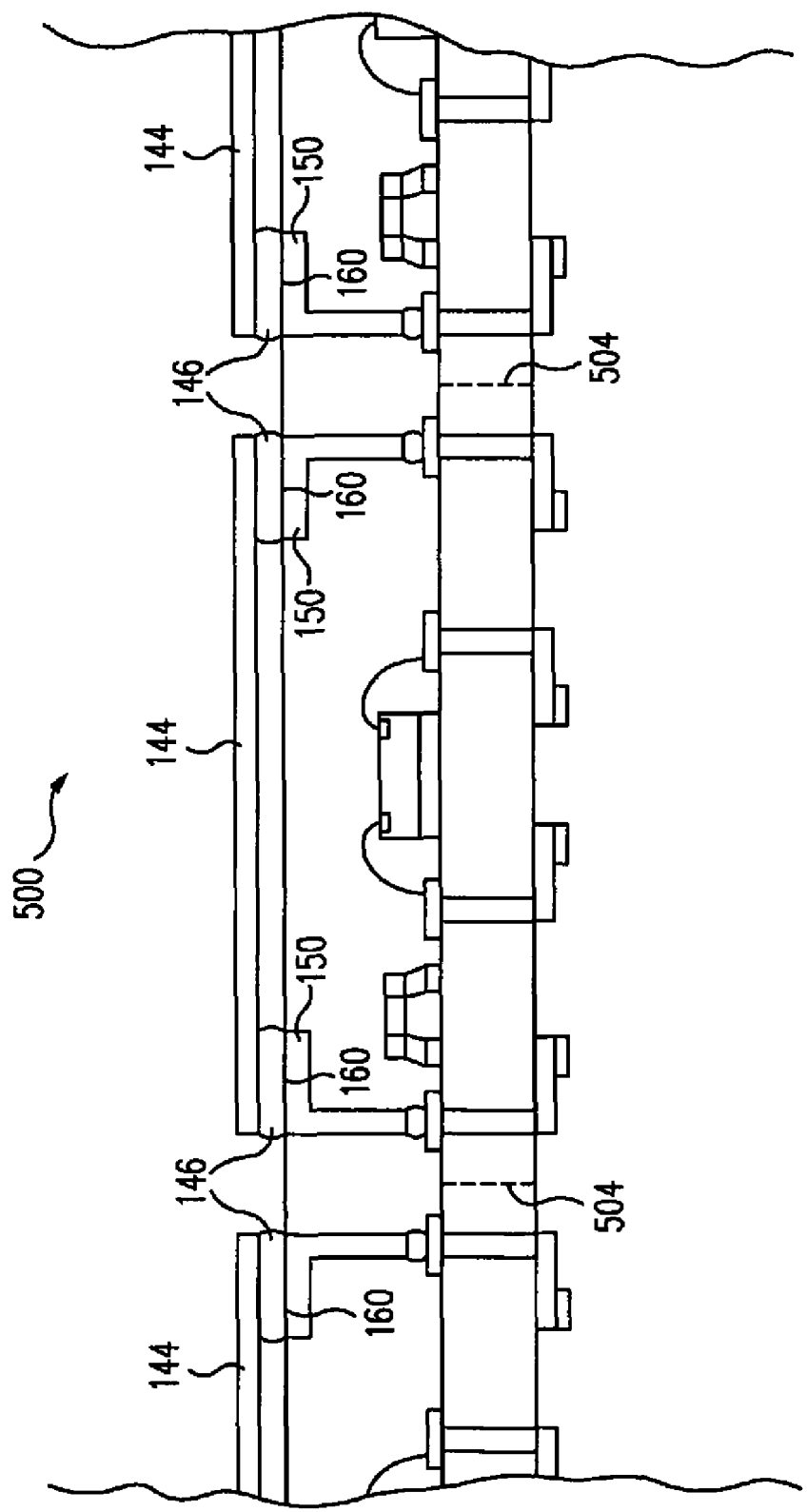

FIG. 8 is a cross-sectional view of assembly 500 of FIG. 7 at a further stage of fabrication in accordance with one embodiment of the present invention. Referring now to FIG. 8, shield lid adhesives 146 are applied to shield lid mounting surfaces 160. Shield lids 144 are placed into shield lid adhesives 146. Shield lid adhesives 146 are cured thus mounting and electrically coupling shield lids 144 to shield lid mounting surfaces 160.

In one embodiment, a surface mount process is used to mount shield lids 144 to shield lid mounting surfaces 160. In accordance with this embodiment, solder paste is applied, e.g., by stencil printing, to shield lid mounting surfaces 160. Shield lids 144 are placed and assembly 500 is heated to reflow the solder paste. Optionally, flux is used before the reflow operation and/or assembly 500 is cleaned after the reflow operation. Accordingly, shield lid adhesives 146 are solder in accordance with this embodiment.

In another embodiment, shield lid adhesives 146 are an electrically conductive epoxy adhesive. In accordance with this embodiment, the electrically conductive epoxy adhesive is applied, for example, with a needle dispenser to shield lid mounting surfaces 160. Shield lids 144 are placed and the electrically conductive epoxy adhesive is cured.

Figure 9:
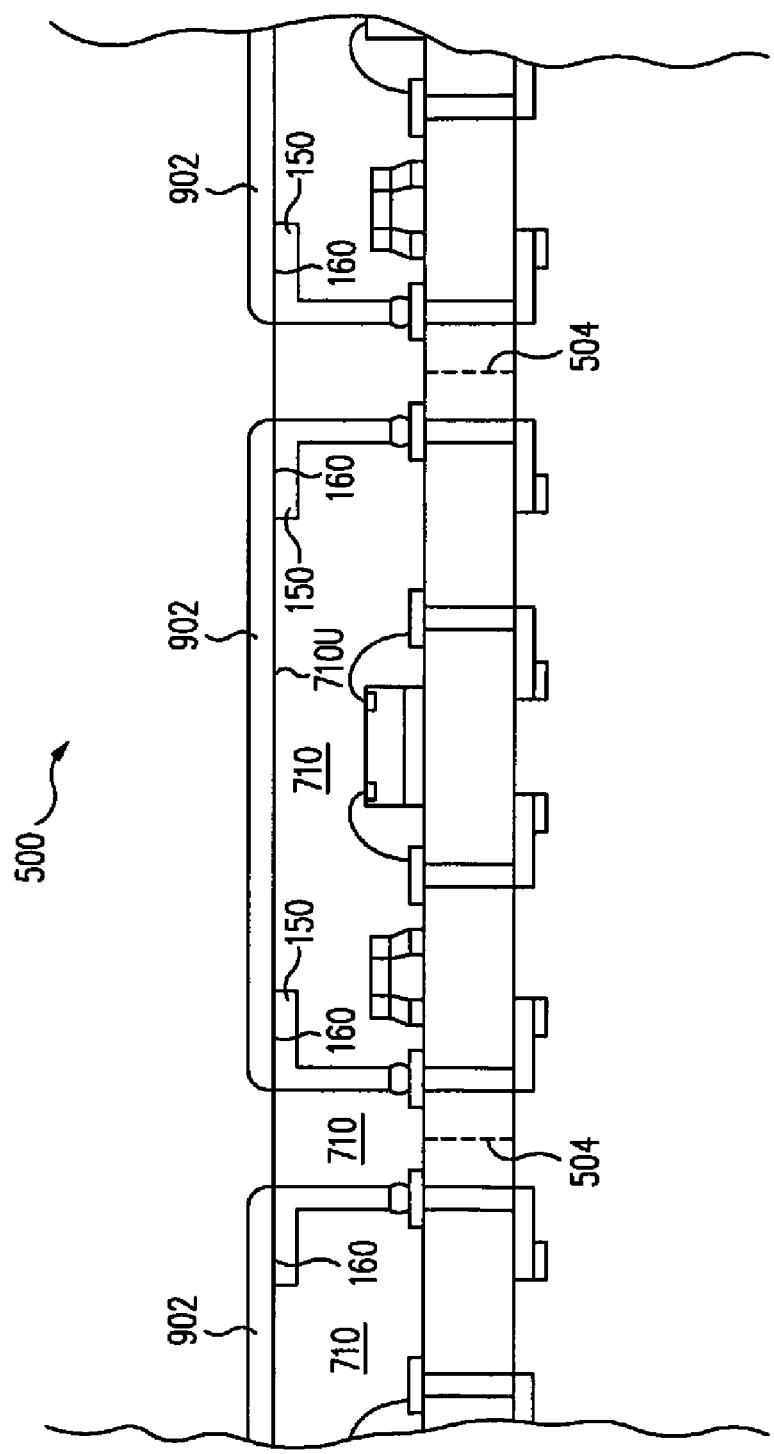
FIG. 9 is a cross-sectional view of the assembly of FIG. 7 at a further stage of fabrication in accordance with another embodiment of the present invention.

FIG. 9 is a cross-sectional view of assembly 500 of FIG. 7 at a further stage of fabrication in accordance with another embodiment of the present invention. Referring now to FIG. 9, an electrically conductive ink 902, sometimes called a shield lid, is formed on selected portions of an upper surface 710U of molding compound 710 and on shield lid mounting surfaces 160. The conductivity of electrically conductive ink 902 is selected to give appropriate shielding effectiveness. In one embodiment, a screen print process is used to apply electrically conductive ink 902. A post cure process may be used to cure/dry electrically conductive ink 902.

Assembly 500 of FIGS. 8, 9 is singulated, e.g., saw singulated, along singulation streets 504 thus completing fabrication of shielded packages 100 (FIGS. 1 and 2), shielded packages 1000 (FIG. 10), respectively. Interconnection balls are populated before or after singulation of assembly 500.

Although the fabrication of a plurality of shielded packages simultaneously is discussed above, in light of this disclosure, those of skill in the art will understand that shielded packages can be formed individually in a similar manner if desired. Illustratively, shielded packages are SiP RF modules or a laminate based overmolded package having EMI shielding protection or to prevent RF emissions.

Figure 10:
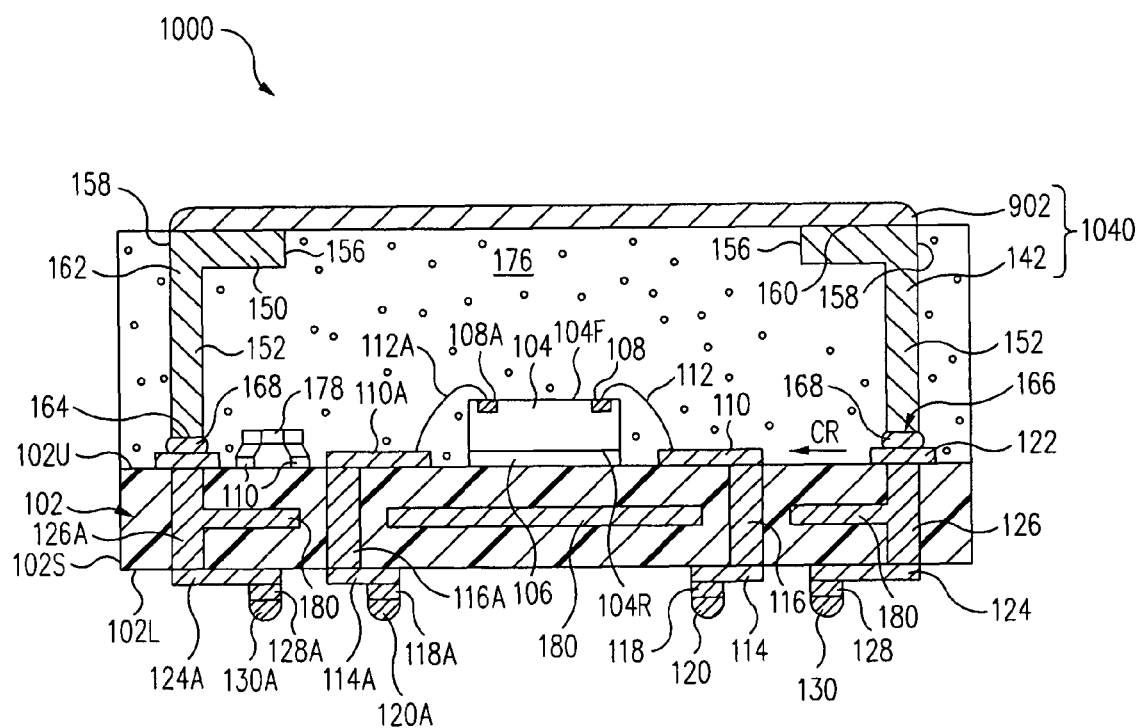
FIG. 10 is a cross-sectional view of a shielded package in accordance with another embodiment of the present invention.

FIG. 10 is a cross-sectional view of a shielded package 1000 in accordance with another embodiment of the present invention. Shielded package 1000 of FIG. 10 is similar to shielded package 100 of FIG. 1 and only the significant differences between shielded packages 100 and 1000 are discussed below.

Shielded package 1000 includes a shield assembly 1040, which functions similarly to shield assembly 140 of shielded package 100. In this embodiment, shield assembly 1040 includes shield fence 142 and electrically conductive ink 902. Electrically conductive ink 902 is a shield lid for shield assembly 1040.

Electrically conductive ink 902 is a planar lid corresponding closely in shape to outer periphery 158 of shield lid mounting ring 150 of shield fence 142. Electrically conductive ink 902 is in direct contact with, and thus electrically coupled to, shield lid mounting ring 150 of shield fence 142. More particularly, electrically conductive ink 902 is in direct contact with, and thus electrically coupled to, shield lid mounting surface 160 of shield lid mounting ring 150.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A structure comprising:
  a substrate comprising a first surface;
  a land and a plurality of traces on the first surface;
  an electronic component coupled to the first surface;
  an encapsulant enclosing the first surface and the electronic component; and
  a shield lid electrically coupled to the land through an electrically conductive shield fence and mechanically coupled via the encapsulant through the shield fence, the shield lid comprising a cured electrically conductive ink in direct contact with a mounting ring of the shield fence and a first surface of the encapsulant, and wherein the electronic component comprises a plurality of bond pads, the structure further comprising bumps enclosed by an underfill material coupling the bond pads to the traces on the first surface of the substrate.

2. The structure of claim 1 wherein the shield lid is electrically coupled to the land by an electrically conductive material extending through the encapsulant.

3. The structure of claim 2 wherein the electrically conductive material comprises copper.

4. The structure of claim 2 wherein the electrically conductive material comprises solder.

5. The structure of claim 4 wherein the solder is on the land.

6. The structure of claim 5 wherein the electrically conductive material further comprises copper extending between the solder and the shield lid.

7. The structure of claim 2 wherein the electrically conductive material comprises posts.

8. The structure of claim 1 wherein the substrate further comprises a second surface, a trace on the second surface of the substrate being coupled to the land.

9. The structure of claim 1 further comprising a ground ring comprising the land.

10. A structure comprising:
  a substrate comprising a first surface;
  a land and a plurality of traces on the first surface;
  an electronic component coupled to the first surface;
  an encapsulant enclosing the first surface and the electronic component; and
  a cured electrically conductive coating formed on and in direct contact with a first surface of the encapsulant and coupled to the land through an electrically conductive shield fence and mechanically coupled via the encapsulant through the shield fence, the electrically conductive coating being in direct contact with a mounting ring of the shield fence, and wherein the electronic component comprises a plurality of bond pads, the structure further comprising bumps enclosed by an underfill material coupling the bond pads to the traces on the first surface of the substrate.

11. A structure comprising:
a substrate comprising a first surface;
a land and a plurality of traces on the first surface;
an electronic component coupled to the first surface;
an encapsulant enclosing the first surface and the electronic component; and
a cured electrically conductive ink in direct contact with a mounting ring of a shield fence comprising an electrically conductive material, the electrically conductive ink being electrically coupled to the land through the shield fence and mechanically coupled via the encapsulant by the electrically conductive material, the electrically conductive ink in direct contact with a first surface of the encapsulant, and wherein the electronic component comprises a plurality of bond pads, the structure further comprising bumps enclosed by an underfill material coupling the bond pads to the traces on the first surface of the substrate.

12. The structure of claim 11 wherein the electronic component comprises a semiconductor device.

13. The structure of claim 11 wherein the electronic component comprises a passive device.

\* \* \* \* \*